United States Patent
Miyake et al.

(10) Patent No.: US 7,842,619 B2
(45) Date of Patent: Nov. 30, 2010

(54) PLASMA PROCESSING METHOD

(75) Inventors: Masatoshi Miyake, Kamakura (JP); Kenji Maeda, Koganei (JP); Kenetsu Yokogawa, Tsurugashima (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 191 days.

(21) Appl. No.: 12/202,692

(22) Filed: Sep. 2, 2008

(65) Prior Publication Data

US 2010/0029024 A1 Feb. 4, 2010

(30) Foreign Application Priority Data

Jul. 30, 2008 (JP) ............................. 2008-196725

(51) Int. Cl.
*H01L 21/00* (2006.01)

(52) U.S. Cl. ..................................... 438/725; 438/905

(58) Field of Classification Search ................ 438/710, 438/714, 725, 905
See application file for complete search history.

(56) References Cited

U.S. PATENT DOCUMENTS

| 5,006,192 A * | 4/1991 | Deguchi ................ 156/345.44 |
| 2008/0266957 A1* | 10/2008 | Moogat et al. ......... 365/185.09 |

FOREIGN PATENT DOCUMENTS

| JP | 11-145111 | 5/1999 |
| JP | 2001-110783 | 4/2001 |
| JP | 2007-080850 | 3/2007 |
| JP | 2008-003449 | 1/2008 |

* cited by examiner

*Primary Examiner*—Richard A. Booth
(74) *Attorney, Agent, or Firm*—Antonelli, Terry, Stout & Kraus, LLP.

(57) ABSTRACT

A plasma processing method includes etching an insulating film of a sample to be processed using plasma generated from etching gas, supplying a large flow of inert gas from above the sample while having the sample mounted on a sample mounting stage, supplying deposit removal gas to only an area near a side wall of a processing chamber, and controlling a plasma density distribution to thereby vary a plasma density at a center area of the processing chamber and a plasma density at an area near the side wall of the processing chamber so as to perform a deposited film removing process for removing the film deposited on the side wall of the processing chamber.

11 Claims, 6 Drawing Sheets

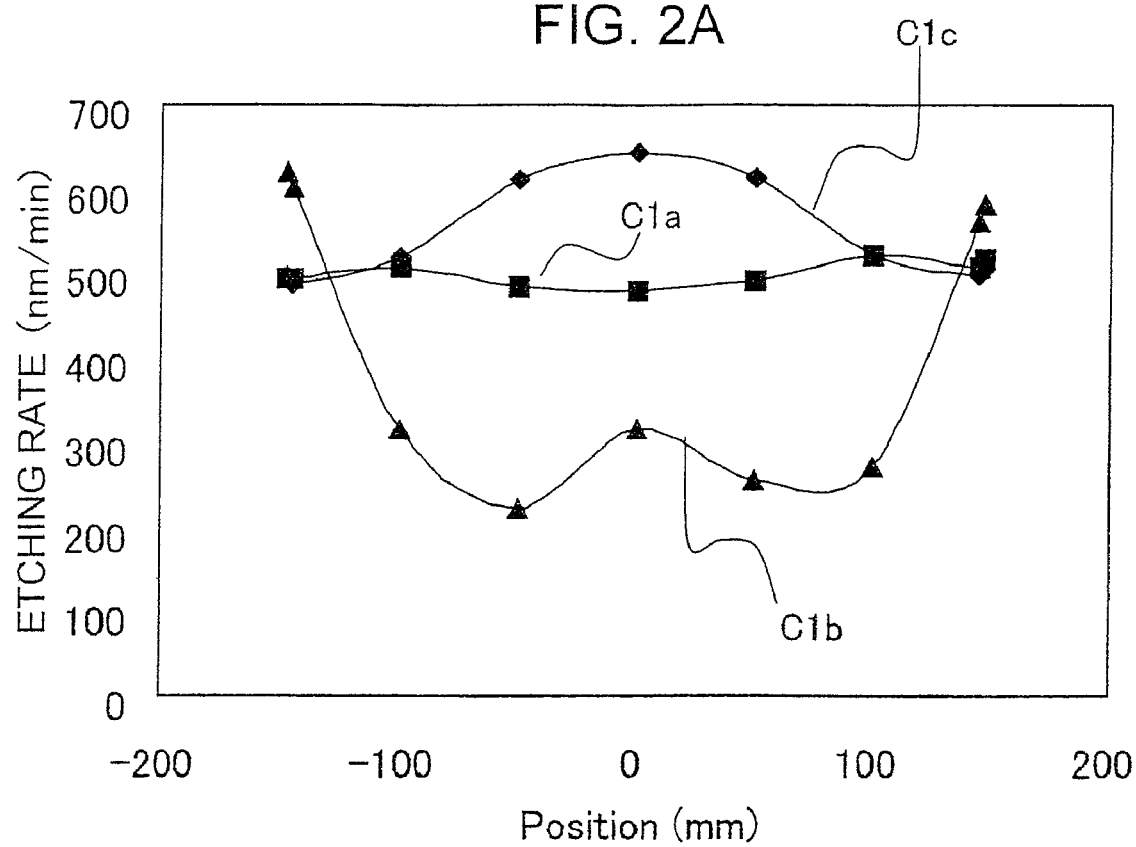
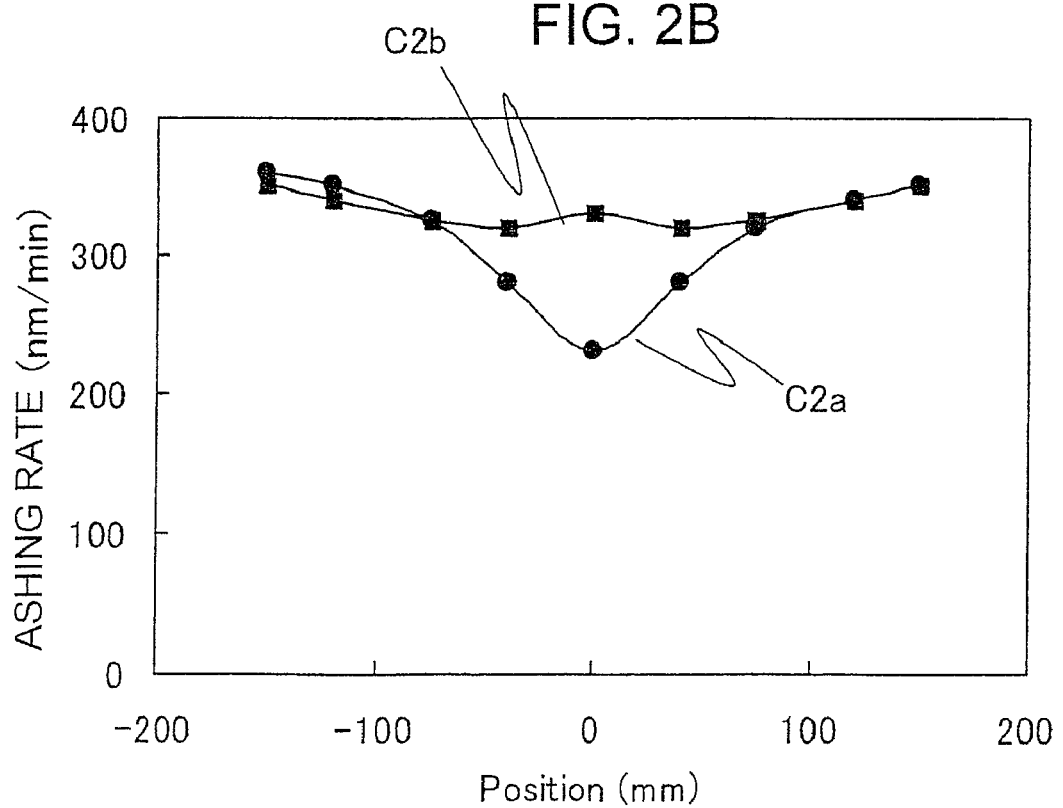

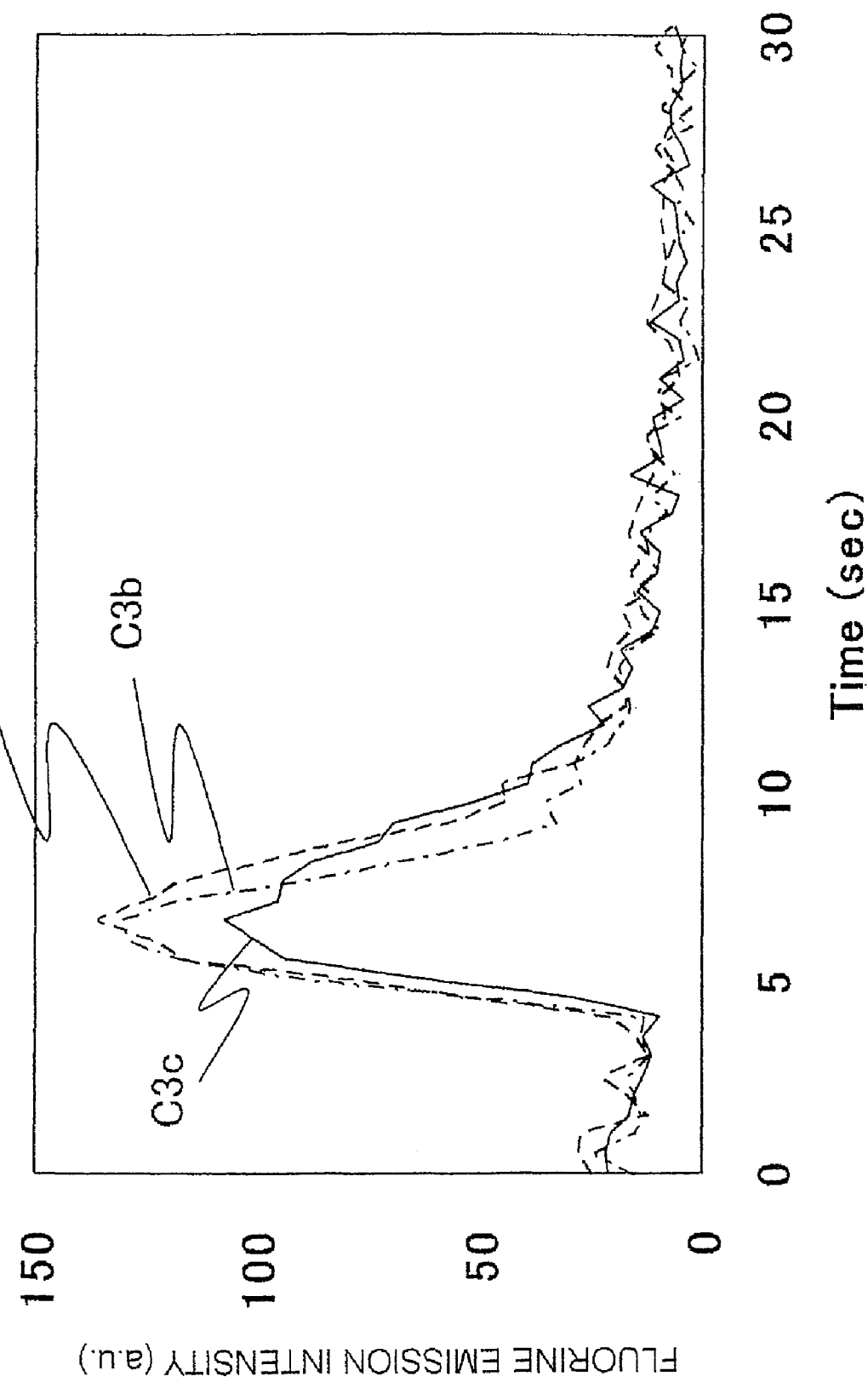

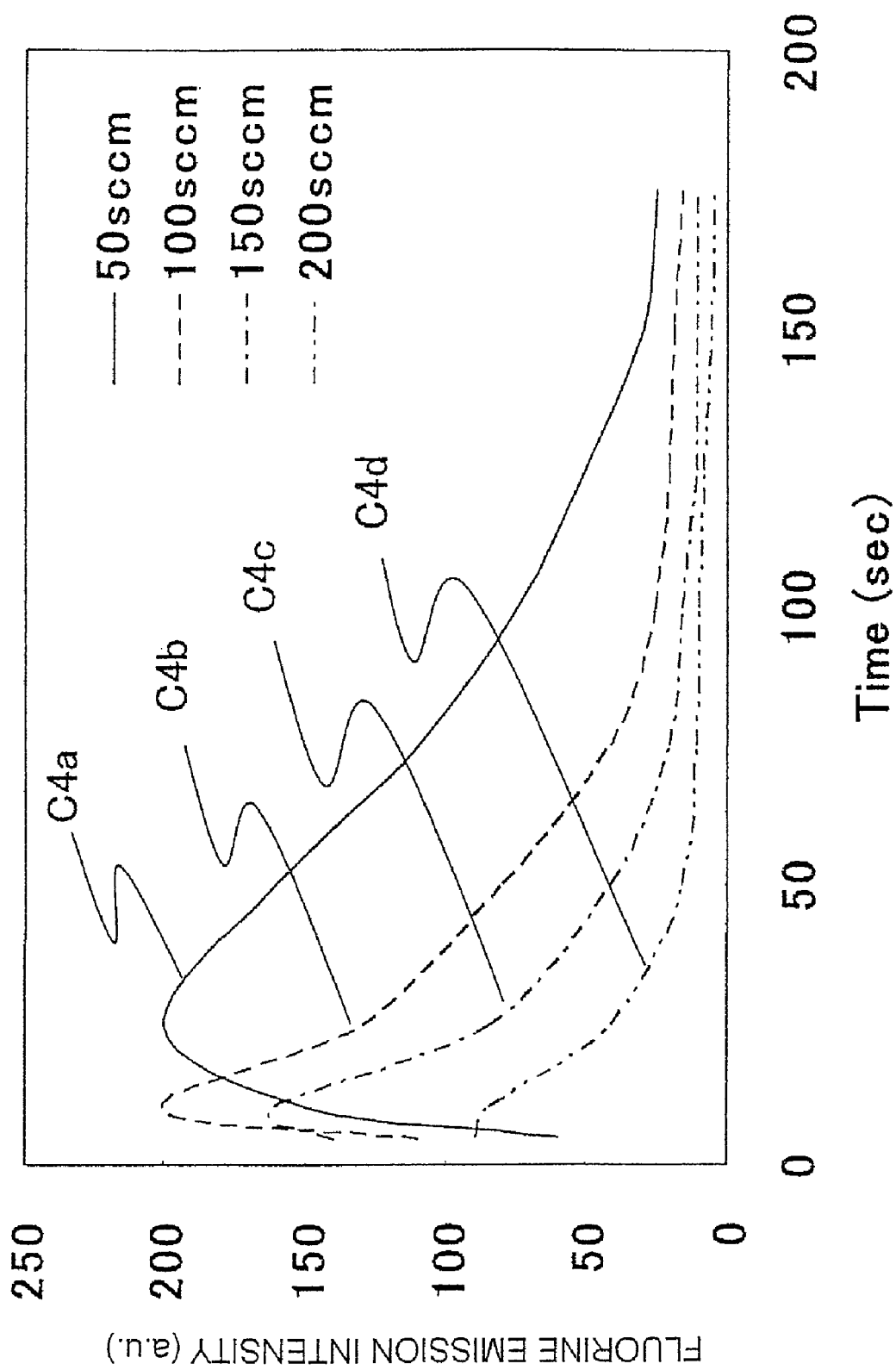

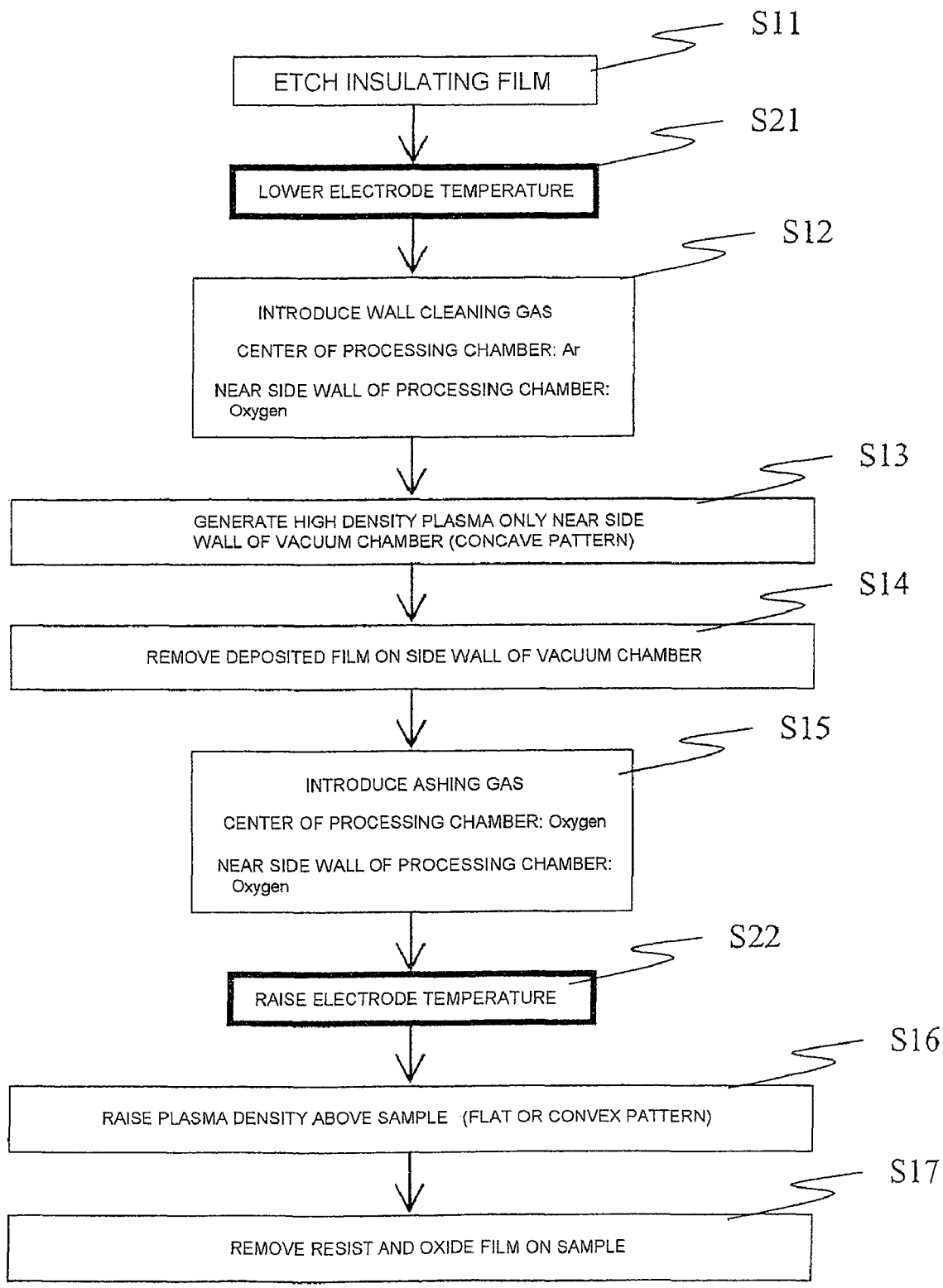

PLASMA PROCESSING METHOD

The present application is based on and claims priority of Japanese patent application No. 2008-196725 filed on Jul. 30, 2008, the entire contents of which are hereby incorporated by reference.

BACKGROUND OF THE INVENTION

1. Field of the Invention

The present invention relates to a plasma processing method using a plasma processing apparatus used for manufacturing semiconductor devices.

2. Description of the Related Art

In the process of manufacturing semiconductor devices, ashing processes are performed to remove resist films and organic films used as mask. Conventionally, ashing has been performed after an etching process in a dedicated ashing device designed separately from an etching apparatus. However, from the viewpoint of reducing processing time, there are demands to realize continuous etching and ashing in the same apparatus.

However, when etching is performed using fluorocarbon gas as main component used mainly for processing insulating films, CF-based films are deposited on the side wall of the reaction chamber. When ashing is performed in this state, the fluorine released when removing the CF-based deposits enter the wafer and cause fluctuation of dimension. Such phenomenon is called a memory effect, since the effect of a past process performed prior to ashing affects the process.

Japanese patent application laid-open publication No. 11-145111 (patent document 1) provides a method for performing ashing in two stages in order to suppress such memory effect. As disclosed in the flowchart of patent document 1, at first in the first stage, oxygen plasma is generated without applying wafer bias, to thereby remove the deposits on the side wall of the reaction chamber. Thereafter, wafer bias is applied to remove the resist films or the like on the wafer.

Japanese patent application laid-open publication No. 2007-80850 (patent document 2) discloses another method for performing ashing in two stages, wherein carbon dioxide plasma is used instead of oxygen plasma so as to suppress damage.

Other prior art methods are disclosed in Japanese patent application laid-open publication Nos. 2001-110783 (patent document 3) and 2008-03449 (patent document 4).

The prior arts mentioned above adopt a method in which the fluctuation of dimension is suppressed by not applying any wafer bias during removal of deposits on the side wall of the reaction chamber. However, in all the prior arts, upon removing the deposits on the side wall of the reaction chamber, plasma similar to that used during ashing performed thereafter by applying wafer bias is generated above the sample to be processed, and the fluorine released from the side wall of the reaction chamber during cleaning of the wall diffuses over the wafer, causing possible fluctuation of dimension. Further, even when carbon dioxide plasma is used, the fluorine diffused from the wall may enter the wafer, and this problem cannot be sufficiently overcome by simply not applying wafer bias. According to the above-mentioned prior arts, damage to the low-k films may occur, or etching of the underlayers (liners) may occur.

SUMMARY OF THE INVENTION

The present invention aims at solving the problems of the prior art mentioned above. The present invention aims at providing an ashing method for further reducing the damage to the low-k films or underlayers.

In order to solve the problems of the prior art mentioned above, the present invention provides a plasma processing method using a plasma processing apparatus comprising a processing chamber, a gas supply means for supplying processing gas independently to a center area of the processing chamber and an area near the side wall thereof; an evacuation means for depressurizing the processing chamber; a sample mounting stage for mounting a sample to be processed; a high frequency power supply for generating plasma; an antenna for supplying a plasma generating high frequency power to the processing chamber; and a plasma generating means for generating plasma in the processing chamber; the method comprising etching an insulating film on the sample to be processed using plasma generated from etching gas; and supplying a large flow of inert gas from an upper area of the sample to be processed while having the sample to be processed mounted on the sample mounting stage, supplying deposit removal gas to only the area near the side wall of the processing chamber, and controlling the plasma density distribution to thereby vary the plasma density at the center area of the processing chamber and the plasma density at the area near the side wall of the processing chamber to perform a deposited film removing process for removing the film deposited on the side wall of the processing chamber.

As described, after the etching of a sample to be processed, the present invention performs a process for removing the deposited film on the side wall of the processing chamber while leaving the sample to be processed placed in the processing chamber without affecting the sample, and thereafter performs ashing. The present invention enables to further reduce the damage applied to the low-k films and underlayers than the prior art and to perform ashing without deteriorating throughput.

BRIEF DESCRIPTION OF THE DRAWINGS

FIG. 2A is a graph showing the relationship between magnetic field distribution and ashing rate distribution, and FIG. 2B is a graph showing the relationship between a phase difference of the frequency applied to the antenna and that applied to the electrode and the ashing rate;

FIG. 3 is a graph showing the relationship between cleaning process time and the emission intensity of fluorine using the plasma distribution as parameter;

FIG. 4 is a graph showing the cleaning process time and the emission intensity of fluorine using the oxygen flow rate as parameter;

FIG. 6 is an explanatory view showing the semiconductor processing step according to the second embodiment of the present invention.

DETAILED DESCRIPTION OF THE PREFERRED EMBODIMENTS

The excessive etching of low-k films that occur unexpectedly at the outer circumference of wafers during ashing is affected by the fluorine released from the CF film deposited on the side wall of the reaction chamber. The present inventors have discovered a method for efficiently removing the CF film deposited on the side wall of the reaction chamber and further reducing the influence of fluoride diffused to the wafer.

The following describes the preferred embodiments of the plasma processing method according to the present invention applied to a semiconductor manufacturing apparatus including a plasma processing apparatus.

[Plasma Processing Apparatus]

Figure 1:
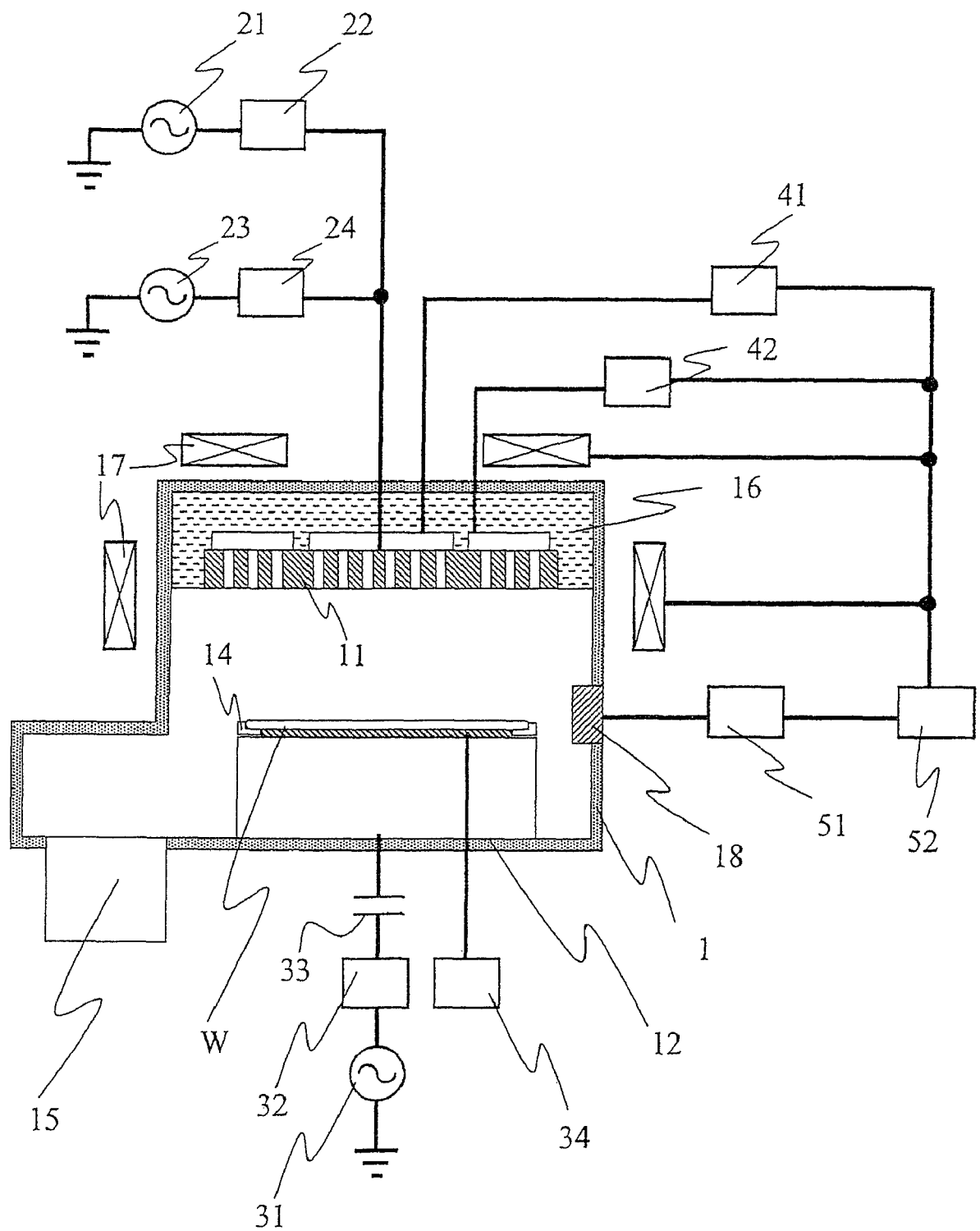
FIG. 1 is a schematic view illustrating the state in which the present invention is applied to a plasma processing apparatus shown in cross-section.

Now, the first embodiment of the present invention will be described with reference to the drawings. The outline of an arrangement of a plasma processing apparatus used in the first embodiment is illustrated in FIG. 1. The plasma processing apparatus of FIG. 1 shows the basic arrangement of the apparatus to which the present invention is applied. The plasma processing apparatus (semiconductor manufacturing apparatus) includes a plurality of magnet coils 17 disposed on the outer side of a vacuum reactor 1 having a first gas introducing means 41, a second gas introducing means 42 and an evacuation means 15, and via the mutual interaction of the electromagnetic waves introduced to an antenna 11 through a coaxial cable and the magnetic field via the above-mentioned magnet coils 17, the gas introduced into the vacuum reactor 1 is turned into plasma. At this time, electromagnetic waves generated from a bias power supply 31 is applied through a matching box 32, a blocking capacitor 33 and via a mounting stage 12 to a sample mounting electrode 13, to thereby subject a sample W to be processed to high speed plasma processing.

Two frequencies are applied to the antenna 11 according to the present invention, one from a first power supply 21 of 200 MHz for generating plasma applied via a first matching box 22 and the other from a second power supply 23 of 4 MHz for controlling potential applied via a second matching box 24. The sample W to be processed has a diameter of 12 inches, and the distance between the sample W and the antenna 11 is 3 cm. The antenna 11 is formed of silicon, and material gas is introduced into the vacuum reactor 1 through the plurality of holes formed to the surface of the silicon. An antenna rear-side dielectric 16 is disposed on the rear side of the antenna 11. Further, the plurality of holes for introducing the material gas into the vacuum reactor are separated into two areas, the center area of the antenna and the outer circumference portion thereof, wherein the material gas supplied from the first gas introducing means 41 can be supplied independently through the center area of the antenna, and the material gas supplied from the second gas introducing means 42 can be supplied independently from the outer circumference portion of the antenna, that is, near the side wall of the processing chamber. Further, an evacuation means 15 such as a turbo molecular pump and a valve (not shown) for adjusting the interior of the processing chamber to predetermined pressure disposed before the evacuation means 15 are provided in order to reduce the pressure of the interior of the processing chamber 1 to a predetermined pressure.

The electromagnetic waves from the second power supply 23 of 4 MHz for controlling potential has a function to control the potential formed between the surface of the antenna 11 and the plasma. The potential on the surface of the silicon can be adjusted arbitrarily by controlling the output of the second power supply 23 of 4 MHz, by which the antenna 11 and the reaction of active species in the plasma can be controlled. A mounting stage 12 for placing a sample W to be processed is disposed in the processing chamber. The mounting stage 12 is provided with a sample stage electrode 13 for attracting the sample W and pusher pins (not shown) for elevating the sample. Further, a temperature controlling device 34 is connected to the sample stage electrode 13, through which the electrode temperature can be controlled.

First Preferred Embodiment

Actual Example of Controlling Plasma Distribution

As shown in FIG. 1, two magnet coils 17 for generating magnetic field disposed around the etching chamber are used to vary the magnetic field distribution, so as to arbitrarily vary the plasma density distribution from concave-pattern distribution to convex-pattern distribution. The principle of plasma distribution control using magnetic field is similar to the principle disclosed in patent document 3.

FIG. 2A illustrates a wafer in-plane etching rate distribution while varying the magnetic field, and FIG. 2B illustrates a wafer in-plane etching rate distribution while performing phase variation of frequencies applied from the power supply 23 for generating plasma and from the bias power supply 31. Etching progresses mainly by the radicals and ions acting as etchant being incident on the wafer surface. The radicals and ions are supplied from the generated plasma, so that the etching rate distribution corresponds roughly to the plasma distribution. FIG. 2A shows the relationship between the position on the sample W being processed and the photoresist etching rate using magnetic field as parameter, and as shown in the drawing, by varying the magnetic field, the etching rate distribution can be changed among a convex pattern (C1c) in which the plasma density at the center becomes highest with respect to the radial direction, a flat pattern (C1a) in which the plasma density is uniform, and a concave pattern (C1b) in which the plasma density at the outer circumference area becomes highest. Especially when the concave pattern distribution (C1b) is selected, the plasma density at the center area of the wafer becomes low, so that it becomes possible to suppress the radicals and ions from being incident on the wafer, and therefore, it becomes possible to reduce the fluctuation of dimension caused by fluorine being incident on the center area of the wafer. On the other hand, since the plasma density at the outer circumference portion is increased, the CF-based deposits deposited on the side wall of the reaction chamber can be removed efficiently.

Further, as shown in FIG. 2B, if the frequency of power from the second power supply 23 applied to the antenna 11 and the frequency of the power applied to the wafer mounting electrode 13 are the same, the plasma distribution can be controlled by varying the phase difference between a pattern with a 180° phase difference (C2b) and a pattern with a 0° phase difference (C2a).

The graph of FIG. 3 will now be used to describe the relationship between the discharge time of oxygen plasma generated for removing fluorine and the emission intensity (703.8 nm) of fluorine contained in the oxygen plasma. As can be seen from FIG. 3, the emission of fluorine rises after starting discharge, the emission is attenuated with time, and after 20 seconds, the emission of fluorine can no longer be observed. The emission of fluorine is caused by the fluorine separated from the CF film deposited within the reaction chamber by the cleaning performed via the oxygen plasma, and therefore, it can be recognized that the cleaning of the reaction chamber has been sufficiently performed when the emission of fluorine has terminated. When plasma distribution has been varied via magnetic field control, if a concave pattern plasma distribution in which the plasma density at the outer circumference portion becomes highest is adopted (C3b), the emission of fluorine will be attenuated in a shorter time compared to the flat pattern (C3a) or the convex pattern (C3c), so that the side wall of the reaction chamber can be cleaned effectively.

Further, magnetic field has been formed using only magnet coils according to the present embodiment, but the aforementioned control of plasma distribution can also be performed by forming a magnetic field using permanent magnets or a combination of permanent magnet and magnet coil to achieve similar effects.

Further, the control of plasma distribution is not only restricted to magnetic fields, but for example, an apparatus having a function to apply high frequency power to only the outer circumference area can be used to generate plasma only at the outer circumference area and not above the wafer, to thereby remove only the deposits attached to the side wall of the reaction chamber.

Second Embodiment

Actual Example of Effect Achieved Through a Large Flow Process

The graph of FIG. 4 is used to describe the relationship between the gas flow rate of oxygen plasma generated to remove fluorine and the emission intensity of fluorine contained in the oxygen plasma. In the present embodiment, when the oxygen flow rate is set to 50 cc (C4a), fluorine emission has been confirmed even after 150 seconds from starting cleaning. However, when the oxygen flow rate is increased, the peak value of emission intensity of fluorine is reduced and the attenuation time thereof becomes shorter, and when the oxygen flow rate is set to 400 cc (C4d), the emission intensity of fluorine was no longer observed after 100 seconds. In FIG. 4, curved line C4b shows the state in which the oxygen flow rate is 100 cc, and curved line C4c shows the state in which the oxygen flow rate is 200 cc.

As described, by increasing the gas flow rate for generating oxygen plasma, the fluorine over the wafer plane can be suppressed, and at the same time, the deposited film deposited on the side wall of the processing chamber can be removed and cleaning can be performed in a short time.

Plasma Processing Steps

Figure 5:
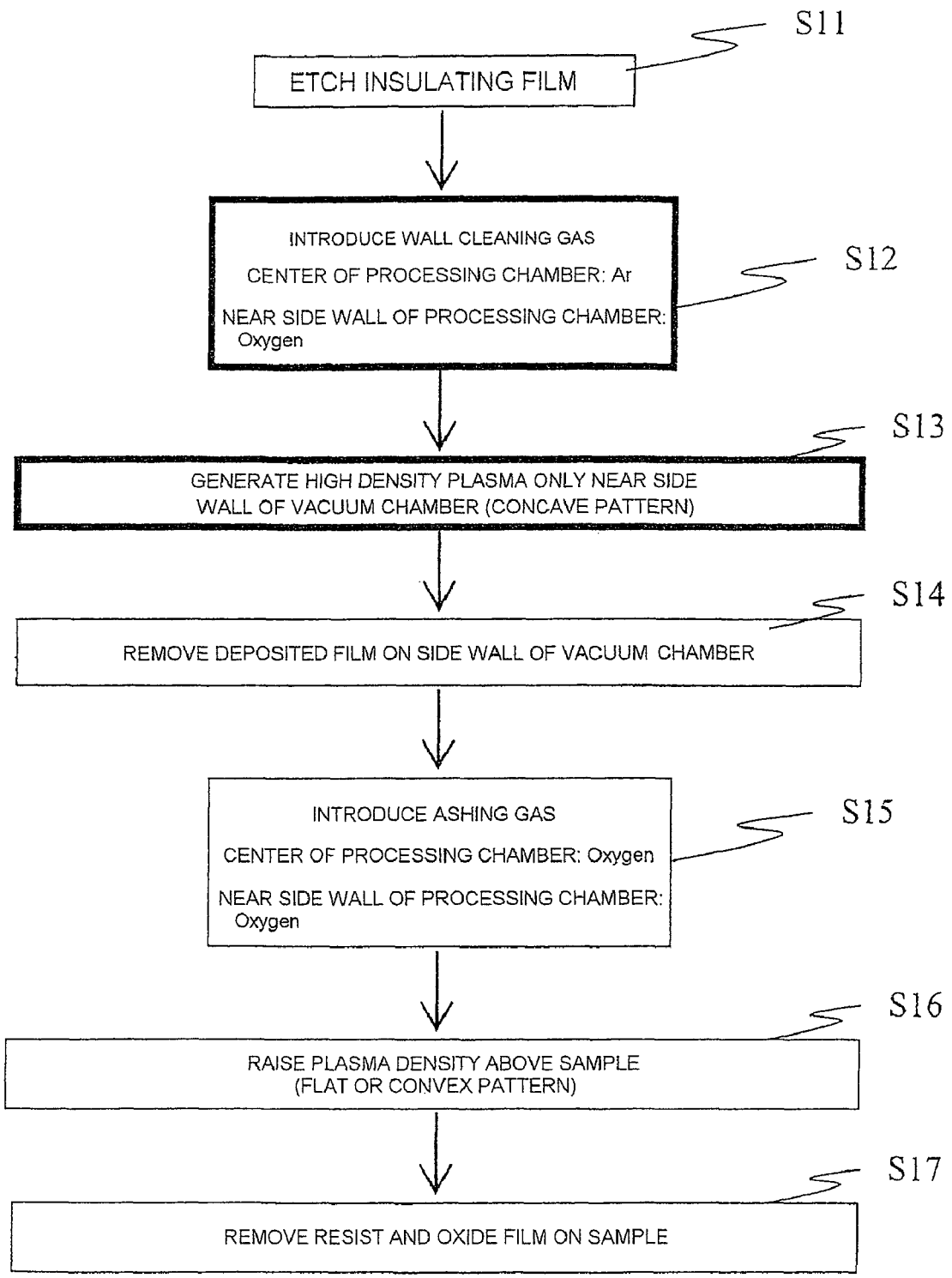
FIG. 5 is an explanatory view showing the semiconductor processing step according to the first embodiment of the present invention.

The steps of the plasma processing method according to the present invention will be described with reference to FIG. 5. At first, a silicon substrate W is placed on a stage 12 of the plasma processing apparatus illustrated in FIG. 1, and then, an insulating film etching step is performed using, for example, a mixed gas containing Ar/C$_4$F$_8$/N$_2$ (S11). High frequency power is applied via the antenna 11 so as to generate plasma in the reaction chamber, and voltage is applied to the sample mounting electrode (lower electrode) 13 so as to attract ions and perform etching. In etching insulating films, processing is performed by turning fluorocarbon gas into plasma, so that no ions are incident on the wafer, and CF-based deposited film is formed on the side wall of the vacuum reactor (processing chamber) 1 not being subjected to temperature control.

Next, a wall cleaning step is performed (S12). The gas used for wall cleaning is supplied via a shower plate, wherein Ar gas is introduced via the center area of the shower plate (center area of the processing chamber) from the first gas introducing means 41, and gas containing oxygen or carbon dioxide is supplied via the outer circumference area of the shower plate (near the side wall of the processing chamber) from the second gas introducing means 42. According further to the present embodiment, the gas flow rate of each of the first gas introducing means 41 and the second gas introducing means 42 is 400 cc or greater.

Next, high frequency power is applied from the first high frequency power supply 21 for generating plasma to the antenna 11 so as to generate plasma. By controlling the current of the magnet coils 17 illustrated in FIG. 1, the magnetic field generated in the reaction chamber 1 is controlled so as to form a concave plasma distribution (C1b of FIG. 2A) (S13). By increasing the plasma density near the side wall, it becomes possible to efficiently remove the CF-based deposits deposited on the side wall of the vacuum reactor and to clean the wall (S14).

Next, gas containing oxygen or carbon dioxide is supplied as ashing gas to the center area and the outer circumference area of the shower plate (S15).

Next, high frequency power is applied from the antenna 11 to thereby control the magnetic field generated in the reaction chamber 1 and generate plasma. At this time, by realizing a flat or convex plasma distribution, the plasma density directly above the sample W to be processed can be increased, and the amount of oxygen radicals being incident on the sample W to be processed can be increased (S16). Thus, the resist and the organic film on the sample W to be processed can be removed more efficiently (S17).

According to these plasma processing steps, when cleaning the wall, the flow rate of gas supplied to the center area of the processing chamber and to the area near the side wall of the processing chamber is increased so as to suppress the amount of fluorine released from the side wall of the vacuum reactor diffusing over the sample W to be processed. Further, by providing a large amount of Ar flow from the center area of the shower plate (directly above the sample to be processed), it becomes possible to suppress the amount of fluorine released from the wall when cleaning the side wall of the reaction chamber diffusing over the sample to be processed, and to suppress the occurrence of low-k damage. Further, by adopting a concave plasma distribution (FIG. 2A C1b), it becomes possible to generate sufficient plasma for removing the CF film on the side wall of the reaction chamber while reducing the plasma density above the sample to be processed placed at the center of the reaction chamber so as to minimize the influence of ions entering the sample to be processed.

The plasma processing method illustrates a means for introducing Ar from the center area of the processing chamber when introducing wall cleaning gas, but it is also possible to suppress fluorine from diffusing above the wafer by introducing rare gas or inert gas other than Ar gas. Further, even through use of ashing gas such as oxygen or carbon dioxide, it is possible to suppress the amount of fluorine released from the wall from being diffused over the wafer by providing a large amount of gas flow. A similar effect can be achieved by supplying gas to the side wall area through a gas supply means for supplying gas to the side wall area of the reaction chamber without using the shower plate.

The above-mentioned plasma processing method illustrates a method for preventing the fluorine generated from CF-based deposits by the cleaning or ashing performed using oxygen gas from affecting the sample to be processed placed on the electrode after etching the insulating film using fluorocarbon gas, but it is also possible to prevent hydrogen generated from deposits during cleaning from affecting the sample to be processed after performing etching using CH-based gas. Moreover, the present embodiment is not restricted to etching insulating films, and in the process of performing etching using plasma by which deposits occur, the side wall of the processing chamber can be cleaned without affecting the sample to be processed placed on the electrode.

According to the present embodiment, processing can be performed without damaging the sample to be processed even by performing etching, wall cleaning and ashing in a single processing chamber and leaving the sample placed on the electrode without removing the sample to be processed from the processing chamber. Further, the above process can also be performed continuously while continuing discharge without extinguishing plasma to achieve similar effects, to improve throughput, and to suppress particles from falling on the sample.

Second Embodiment

Now, the second embodiment of the present invention will be described with reference to the drawings. The present embodiment differs from the former embodiment in that the electrode temperature can be changed speedily via the temperature control apparatus 34 of the plasma processing apparatus illustrated in FIG. 1. In the present embodiment, a direct-expansion electrode disclosed in patent document 2 or patent document 4 is used as a means for controlling the temperature of the electrode 13 on which the sample W to be processed is placed, according to which a high speed control of approximately 1° C./sec is realized. Furthermore, the electrode is equipped with a heater, by which the temperature can be raised.

The steps according to the plasma processing method of the present embodiment will now be described with reference to FIG. 6.

At first, as shown in step S11 of FIG. 6, a sample W to be processed is placed on the stage 12 of the plasma processing apparatus illustrated in FIG. 1, and an insulating film etching step is performed. A mixed gas of $Ar/C_4F_8/N_2$ is used as etching gas, for example. High frequency power is applied from the antenna 11, by which plasma is generated in the reaction apparatus, and voltage is applied to the lower electrode to attract ions and perform etching (S11). The present etching process is similar to the etching step S11 of FIG. 5.

Next, at the time when etching of the insulating film is completed, a direct-expansion temperature control apparatus is used as the temperature control apparatus 34 of FIG. 1 to lower the set temperature of the sample mounting electrode 13 on which the sample W is placed to 0° C. or lower.

Thereafter, wall cleaning is performed with the sample W placed on the sample mounting electrode 13. At first, wall cleaning gas is introduced to the processing chamber. The gas used for wall cleaning is supplied via the shower plate, wherein Ar gas is introduced from the first gas supply means 41 through the center area of the processing chamber (center area of the shower plate), and gas containing oxygen or $CO_2$ is introduced from the second gas supply means 42 from near the side wall of the processing chamber (outer circumference of the shower plate) According to the present embodiment, the gas flow rate is set to a large flow rate of 400 ccm or higher (S12).

In step S13, high frequency power is supplied from the first high frequency power supply 21 for generating plasma via the antenna 11 so as to generate plasma. By controlling the current of the magnet coils 17 illustrated in FIG. 1, the magnetic field generated in the reaction chamber is controlled to form a convex plasma distribution (S13), to thereby remove the deposited film on the side wall of the vacuum reactor (S14). The wall cleaning process is similar to the wall cleaning steps S13 and S14 illustrated in FIG. 5.

When the end point of the wall cleaning step is detected, ashing gas containing oxygen gas is introduced from the center area of the processing chamber and the area near the side wall of the processing chamber, to thereby prepare for transition to the ashing process (S15).

Next, in step S22, the temperature is raised to above the set temperature of electrode (for example, 20° C.) on which the sample is placed. Thereafter, the ashing step of step S16 is performed. The gas used for ashing is gas containing oxygen or carbon dioxide supplied from both the center area and the outer circumference of the shower plate.

In step S16, a flat or convex plasma distribution is selected. By increasing the plasma density directly above the wafer, the amount of oxygen radicals being incident on the wafer can be increased. Thus, the carbon film formed on the surface of the wafer can be removed more efficiently. Thus, it becomes possible to remove resists and organic films on the sample to be processed (S17).

According to the present embodiment, Ar is introduced from the center area when introducing wall cleaning gas, but rare gas other than Ar gas or ashing gas such as oxygen or carbon dioxide can be introduced to achieve the effect of preventing fluorine released from the wall from entering the wafer.

According to the present embodiment, the temperature of the sample to be processed is lowered during the wall cleaning step, so that even when fluorine or oxygen radicals enter the sample to be processed, the reaction thereof can be suppressed, and damage can be reduced. By increasing the temperature of the sample to be processed during the ashing step, it becomes possible to increase the reaction speed with oxygen radicals and to promote efficient ashing.

Third Embodiment

Now, the third embodiment of the present invention will be described with reference to the drawings. The embodiment according to the present invention is shown in FIG. 1. The third embodiment basically adopts the same arrangement as the first embodiment, but differs therefrom in that it can control the plasma processing with even higher accuracy by using a device 18 for monitoring the emission of fluorine in the plasma, a device 51 for analyzing emission, and an apparatus 52 capable of controlling magnetic field distribution and processing gas based on the emission analysis.

According to the present embodiment, during the wall cleaning step performed after the insulating film etching using the plasma processing apparatus of FIG. 1, emission from the plasma is dispersed via the emission analyzing means 51 to thereby measure the emission intensity of fluorine. The emission of fluorine is caused by the fluorine separated from the CF film deposited within the reaction chamber during the wall cleaning process performed using oxygen plasma or the like, so it can be determined that sufficient cleaning of the reaction chamber has been performed when emission of fluorine is no longer observed. Through use of this phenomenon, a control signal is sent from a feedback means via a communication line to the gas supply device 41 and 42 and the magnetic field controlling coils 17 when the emission intensity of fluorine has been reduced below a set threshold value and that sufficient cleaning of the wall is recognized to be performed. Thereafter, the ashing step is started and the organic film on the sample to be processed is removed.

According to the above-described embodiment, whether sufficient cleaning of the side wall of the processing chamber has been performed or not is determined by measuring the emission intensity of fluorine, but it is also possible to determine whether sufficient cleaning of the side wall of the processing chamber is performed or not by measuring the carbon, oxygen, carbon monoxide or carbon dioxide generated when CF film is removed by the oxygen plasma or carbon dioxide plasma.

Moreover, the present embodiment illustrated a means for generating plasma by applying a high frequency power to the electrode disposed on the side opposed to the sample to be processed by the plasma generating means independent from that applied to the sample, but a similar effect can be achieved through use of a plasma processing apparatus in which plasma is generated using a means for generating plasma by applying high frequency power to the mounting stage of the sample, by an inductively coupled plasma generating means, or by a mutual interaction of the magnetic field and the high frequency electric field.

Further, the actual wall cleaning step performed in the present research was performed under the following conditions: 400 ccm of O2-based gas; approximately 2 Pa pressure; 20° C. semiconductor wafer temperature; and approximately 200 W wafer bias. Similar effects can be achieved by adopting a gas species, gas flow rate, pressure, wafer set temperature and wafer bias that is not greatly deviated from the above-described condition. Furthermore, as a pretreatment of wall cleaning, a process using fluorocarbon-based gas as the main component of material gas for generating plasma can be applied to a process for etching a film having a main material of either $SiO_2$, SiC, SiOC, SiOCH, SiN or $Si_3N_4$ on the surface of the silicon substrate being the sample to be processed. Of course, the insulating film used for etching can be applied for etching a multilayer structure including two or more layers selected from $SiO_2$, SiC, SiOC, SiOCH, SiN and $Si_3N_4$ formed on a silicon substrate being the sample to be processed using the plasma processing apparatus.

As described, the present invention having a high industrial applicability improves the yield in the process of manufacturing semiconductor devices.

What is claimed is:

1. A plasma processing method using a plasma processing apparatus comprising a processing chamber, a gas supply means for supplying processing gas independently to a center area of the processing chamber and to an area near the side wall thereof; an evacuation means for depressurizing the processing chamber; a sample mounting stage for mounting a sample to be processed; a high frequency power supply for generating plasma; an antenna for supplying a plasma-generating high frequency power to the processing chamber; and a plasma generating means for generating plasma in the processing chamber; the method comprising:
    etching an insulating film of the sample to be processed using plasma generated from etching gas; and
    supplying a large flow of inert gas from above the sample while having the sample mounted on the sample mounting stage, supplying deposit removal gas to only the area near the side wall of the processing chamber, and controlling the plasma density distribution to thereby vary the plasma density at the center area of the processing chamber and the plasma density at the area near the sidewall of the processing chamber to perform a deposited film removing process for removing the film deposited on the side wall of the processing chamber.

2. The plasma processing method according to claim 1, wherein
    the deposited film removing process of the side wall of the processing chamber reduces the plasma density near the center area of the processing chamber with respect to the plasma density near the side wall of the processing chamber.

3. The plasma processing method according to claim 1, wherein
    the inert gas supplied from the center area of the processing chamber during the deposited film removing process is rare gas.

4. The plasma processing method according to claim 1, wherein
    the gas supplied from the center area of the processing chamber during the deposited film removing process contains rare gas and inert gas.

5. The plasma processing method according to claim 1, wherein
    the etching process for etching the insulating film is performed using etching gas containing fluorocarbon.

6. The plasma processing method according to claim 1, wherein
    the plasma density distribution within the processing chamber is controlled by controlling the phase difference of plasma generating high frequency power supplied to the antenna and the high frequency power supplied to the sample mounting stage.

7. The plasma processing method according to claim 1, wherein
    the plasma processing apparatus further comprises a detection means for detecting the change of emission intensity of specific atoms or molecules in the plasma; and
    during the process for removing the deposited film on the side wall of the processing chamber, the amount of gas supplied from above the sample or the plasma density distribution within the reaction chamber is varied according to the change in the emission intensity of the specific atoms or molecules in the plasma.

8. The plasma processing method according to claim 1, wherein
    the specific atoms or molecules in the plasma are fluorine, carbon, oxygen and carbon monoxide.

9. The plasma processing method according to claim 1, wherein
    prior to performing the process of removing the deposited film on the side wall of the processing chamber, the temperature of the sample is lowered.

10. The plasma processing method according to claim 1, wherein
    after performing the process of removing the deposited film on the sidewall of the processing chamber, ashing gas is supplied from the center area of the processing chamber, wherein by controlling the plasma density distribution, the plasma density at the center area of the processing chamber is increased to perform ashing of the sample to be processed.

11. The plasma processing method according to claim 10, wherein
    after performing the process of removing the deposited film on the side wall of the processing chamber, the temperature of the sample is raised before increasing the plasma density at the center area of the processing chamber.

* * * * *